US008059837B2

(12) United States Patent
Wu

(10) Patent No.: US 8,059,837 B2
(45) Date of Patent: Nov. 15, 2011

(54) AUDIO PROCESSING METHOD AND SYSTEM

(75) Inventor: Li-Te Wu, Taipei (TW)

(73) Assignee: Fortemedia, Inc., Cupertino, CA (US)

(*) Notice: Subject to any disclaimer, the term of this patent is extended or adjusted under 35 U.S.C. 154(b) by 853 days.

(21) Appl. No.: 12/121,078

(22) Filed: May 15, 2008

(65) Prior Publication Data

US 2009/0285414 A1 Nov. 19, 2009

(51) Int. Cl.
*H04R 3/00* (2006.01)
*H03F 99/00* (2009.01)
*H04R 25/00* (2006.01)

(52) U.S. Cl. ........ 381/113; 381/174; 381/111; 381/121; 381/120

(58) Field of Classification Search .................. 381/111, 381/113, 120, 121, 174
See application file for complete search history.

(56) References Cited

U.S. PATENT DOCUMENTS

| | | | | |
|---|---|---|---|---|
| 3,939,468 | A * | 2/1976 | Mastin | 367/22 |
| 7,634,096 | B2 * | 12/2009 | Fallesen | 381/113 |
| 7,756,279 | B2 * | 7/2010 | Deruginsky et al. | 381/95 |
| 7,929,716 | B2 * | 4/2011 | Niwa et al. | 381/113 |
| 2007/0237345 | A1 * | 10/2007 | Zhang et al. | 381/113 |

* cited by examiner

*Primary Examiner* — Luan C Thai
(74) *Attorney, Agent, or Firm* — Thomas|Kayden

(57) ABSTRACT

An audio processing system is provided. The audio processing system comprises a transducer, a gain stage, a capacitor network, and a preamplifier. The transducer transduces a sound signal to a voltage signal. The gain stage comprises an input coupled to the transducer and an output. The capacitor network, coupled between the output of the gain stage and the transducer, provides an equivalent capacitance. The preamplifier coupled to the transducer amplifies the voltage signal.

16 Claims, 6 Drawing Sheets

AUDIO PROCESSING METHOD AND SYSTEM

BACKGROUND OF THE INVENTION

1. Field of the Invention

The invention relates to a microphone, and more particularly to an audio processing method and system eliminating electromagnetic wave interference.

2. Description of the Related Art

An electret condenser microphone (ECM) is the most popular microphone for consumer devices due to its low cost and small size. FIG. 1 shows an explosion view of an ECM. ECM 100 comprises a metal cabinet 102, a diaphragm 104, a backplate 106, a microphone IC 108, and a printed circuit board (PCB) 110. There is a sound hole 112 on the top of the metal cabinet 102, so the sound signal can propagate through the sound hole 112. The received sound signal vibrates the diaphragm 104 and changes the distance between diaphragm 104 and backplate 106 to transduce the received sound signal to a voltage signal. Microphone IC 108 comprises a preamplifier configured to receive the transduced voltage signal and amplify it. PCB 110 is used to support microphone IC 108 and provide mechanical protection.

BRIEF SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

An audio processing system is provided. The audio processing system comprises a transducer, a gain stage, a capacitor network, and a preamplifier. The transducer transduces a sound signal to a voltage signal. The gain stage comprises an input coupled to the transducer and an output. The capacitor network, coupled between the output of the gain stage and the transducer, provides an equivalent capacitance. The preamplifier coupled to the transducer amplifies the voltage signal.

An audio processing method used in a microphone is also provided. Firstly, a sound signal is received, and the sound signal is transduced to a first voltage signal. Next, a preamplifier is provided to amplify the first voltage signal. Finally, a negative capacitance is provided for reducing a parasitic capacitance on an input node of the preamplifier before the first voltage is amplified.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

One or more specific embodiments of the invention are described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacturing for those of ordinary skill in the art having the benefit of this disclosure.

In the following detailed description, reference is made to the accompanying drawings which form a part hereof, shown by way of illustration of specific embodiments. These embodiments are described in sufficient detail to enable those of ordinary skill in the art to practice the invention, and it is to be understood that other embodiments may be utilized and that structural, logical and electrical changes may be made without departing from the spirit and scope of the present invention.

Figure 2:
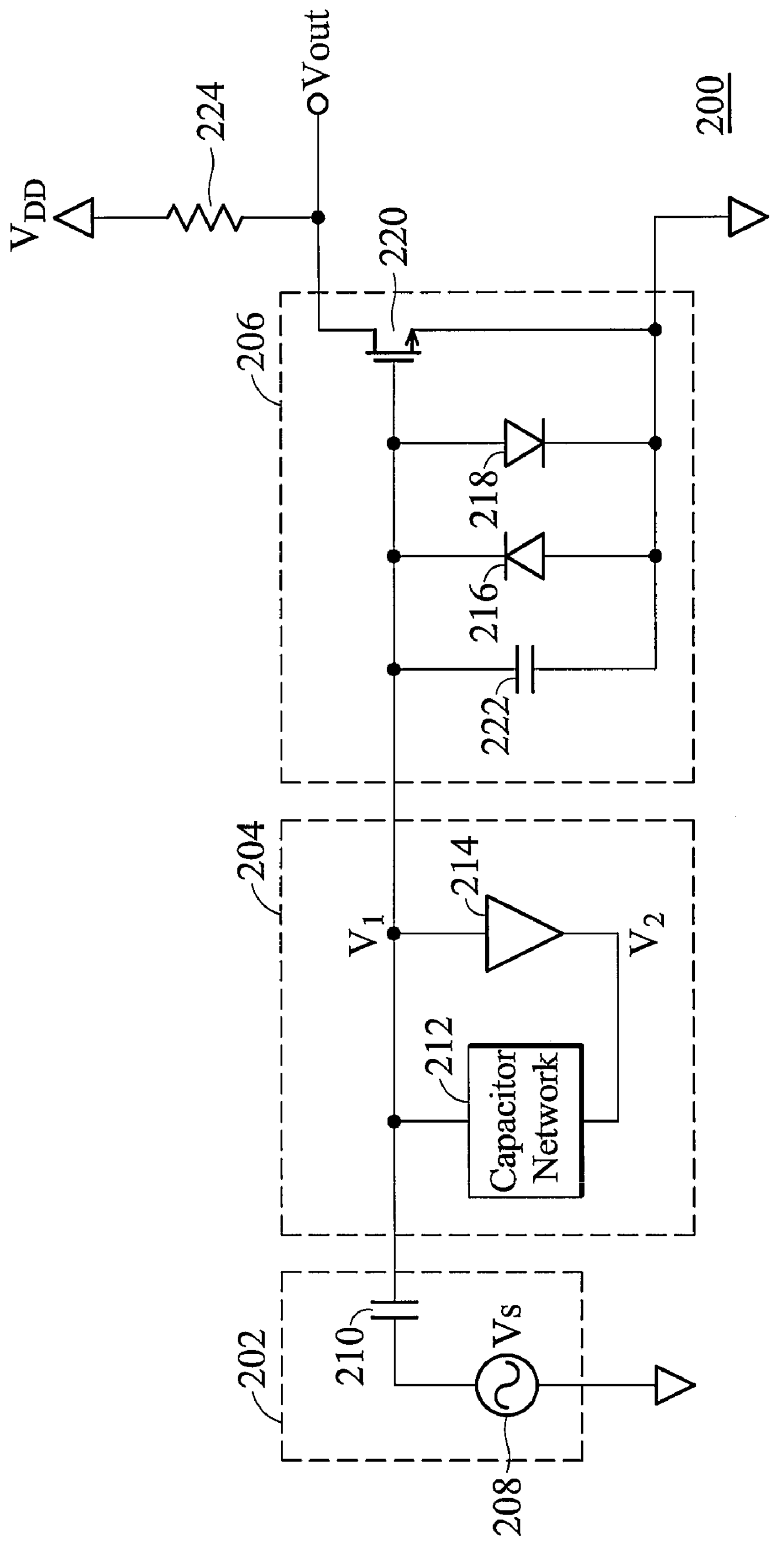
FIG. 2 is an embodiment of an ECM according to the invention.

FIG. 2 shows an embodiment of an ECM according to the invention. Microphone 200 is an equivalent model of the ECM comprising a transducer 202, a capacitance reduction circuit 204, and a preamplifier 206.

Figure 1:
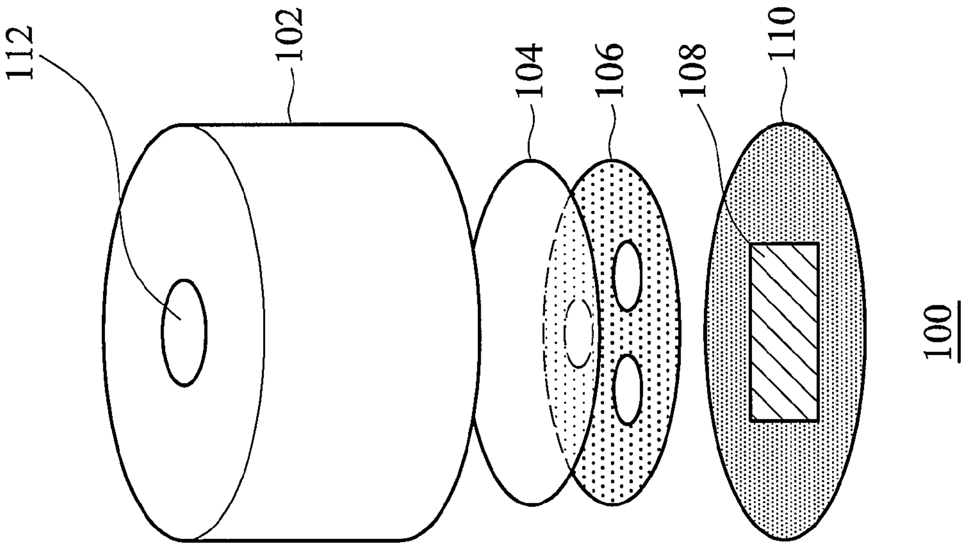
FIG. 1 (RELATED ART)
FIG. 1 is an explosion view of a conventional ECM.

Transducer 202 is an equivalent model of a diaphragm (e.g. 104 in FIG. 1) and a backplate (e.g. 106 in FIG. 1), comprising a voltage source 208 and a capacitor 210. The diaphragm and the backplate together form capacitor 210. The capacitance between the diaphragm and the backplate changes according to the received sound signal. Either the diaphragm or the backplate is coated with a charge storage layer (also referred to as electret). The charge storage layer is pre-polarized by an electric field with a voltage such as 200V. The built-in voltage is therefore 200V.

The pre-charged charge on the electret remains the same during operation since there is no leakage path of the electret. The voltage across the capacitor and the capacitance of the capacitor when the diaphragm moves x (which is a bias from a balance point) are respectively V(x) and C(x). The following equations hold:

$$Q = C(x=0)\cdot V(x=0) = C(x)\cdot V(x)$$

$$C(x) = \varepsilon_0 \frac{A}{x_0 + x}$$

where $\epsilon_0$ is dielectric constant=$8.85\times10^{-14}$, A is the area of the capacitor (or equivalently, the area of diaphragm), $x_0$ is the spacing between the diaphragm and the backplate at the balance point (i.e. no sound input), and x is the additional movement biased from the balance point. Accordingly, the voltage across the capacitor is proportional to the input sound level. Therefore, the sound pressure can be translated into voltage signal across the capacitor, and the capacitance of capacitor 210 is about 5 pF~10 pF for modern ECMs.

Capacitance reduction circuit 204 comprises a capacitor network 212 and a gain stage 214. Gain stage 214 comprises an input coupled to the transducer and an output. Capacitor network 212 coupled between the output of gain stage 214 and transducer 202 provides an equivalent capacitance. Preamplifier 206 coupled to transducer 202 amplifies the voltage signal transduced from the sound signal. Preamplifier 206 can comprise a pair of diodes 216 and 218 and a JFET 220. The pair of diodes 216 and 218, coupled between the transducer 202 and the ground with an inverse parallel connection (i.e. one is forward and the other is backward), provides a current path for electrostatic discharge. The size of diodes 216 and 218 should be made large enough to discharge the electrostatic current that may destroy microphone 200, however also induce a large parasitic capacitance. JFET 220 is modeled as a pure JFET without parasitic effect, and has a gate coupled to transducer 202, a source coupled to the ground, and a drain coupled to an output $V_{out}$ and a load resistor 224 coupled to supply voltage $V_{DD}$. JFET 220 is biased as a common source configuration, and the gain at the drain of JEFT 220 can be calculated as: $A_{JFET}=G_m \cdot R_L$, where $G_m$ is the trans-conductance of JEFT 220 and $R_L$ is the resistance of load resistor 224. Capacitor 222 is the overall parasitic capacitance induced from diodes 216 and 218 and JFET 220, and the gain stage and the capacitor network together form a negative capacitance to reduce the parasitic capacitance. The negative capacitance can be controlled by the equivalent capacitance of capacitor network 212 and the gain of gain stage 214, and is described in detail as follows.

Kirchhoff current conservation law implies that the total net input currents for any node is zero, so for the input node of preamplifier 206, the net current would be:

$$sC_1(V_S-V_1)+sC_2(0-V)+sC_3(V_2-V_1)=0,$$

where Vs is the voltage transduced from the sound signal, V1 is the voltage at the input node of preamplifier 206, V2 is the voltage at the output of gain stage 214, C1 is the capacitance of capacitor 210, C2 is the capacitance of parasitic capacitor 222, and C3 is the equivalent capacitance of capacitor network 212.

Further assume that the gain of gain stage 214 is G, then:

$$sC_1(V_s - V_1) + sC_2(-V_1) + sC_3(GV_1 - V_1) = 0, \text{ and}$$

$$V_1 = \frac{C_1}{C_1 + C_2 + (1 - G)\cdot C_3} V_s.$$

Apparently, voltage Vs will be degraded at the input node of preamplifier 206 if capacitance reduction circuit 204 is not applied, i.e. (1−G)·C3=0. In a specific case, when capacitance reduction circuit 204 is applied, voltage V1 will remain the same as voltage Vs if gain G is chose as 2 and equivalent capacitance C3 is chosen as the same as parasitic capacitance C2, voltage Vs will not be affected by the parasitic capacitance.

Figure 3:
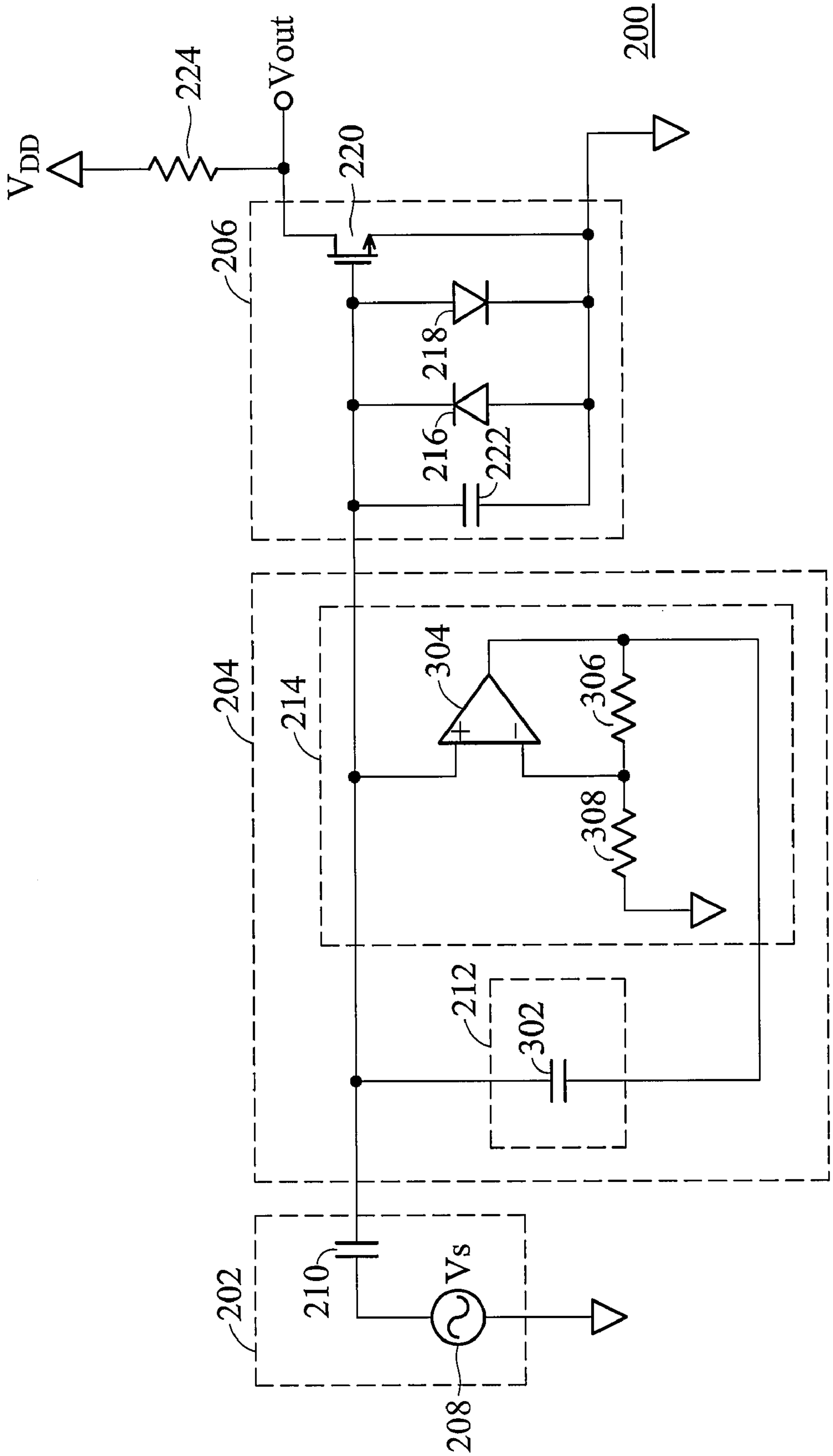
FIGS. 3-5 shows different embodiments of the capacitance reduction circuit in FIG. 2.
Figure 4:
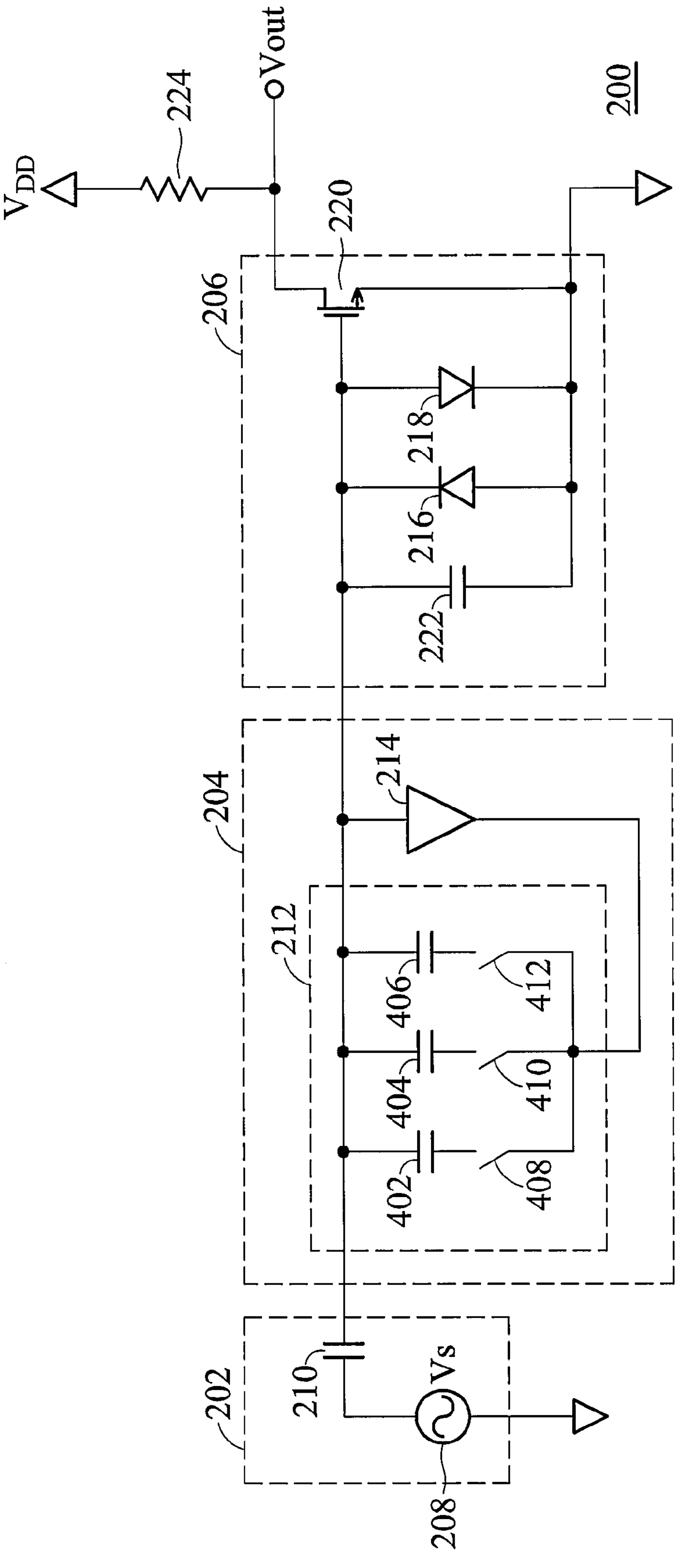
Figure 5:
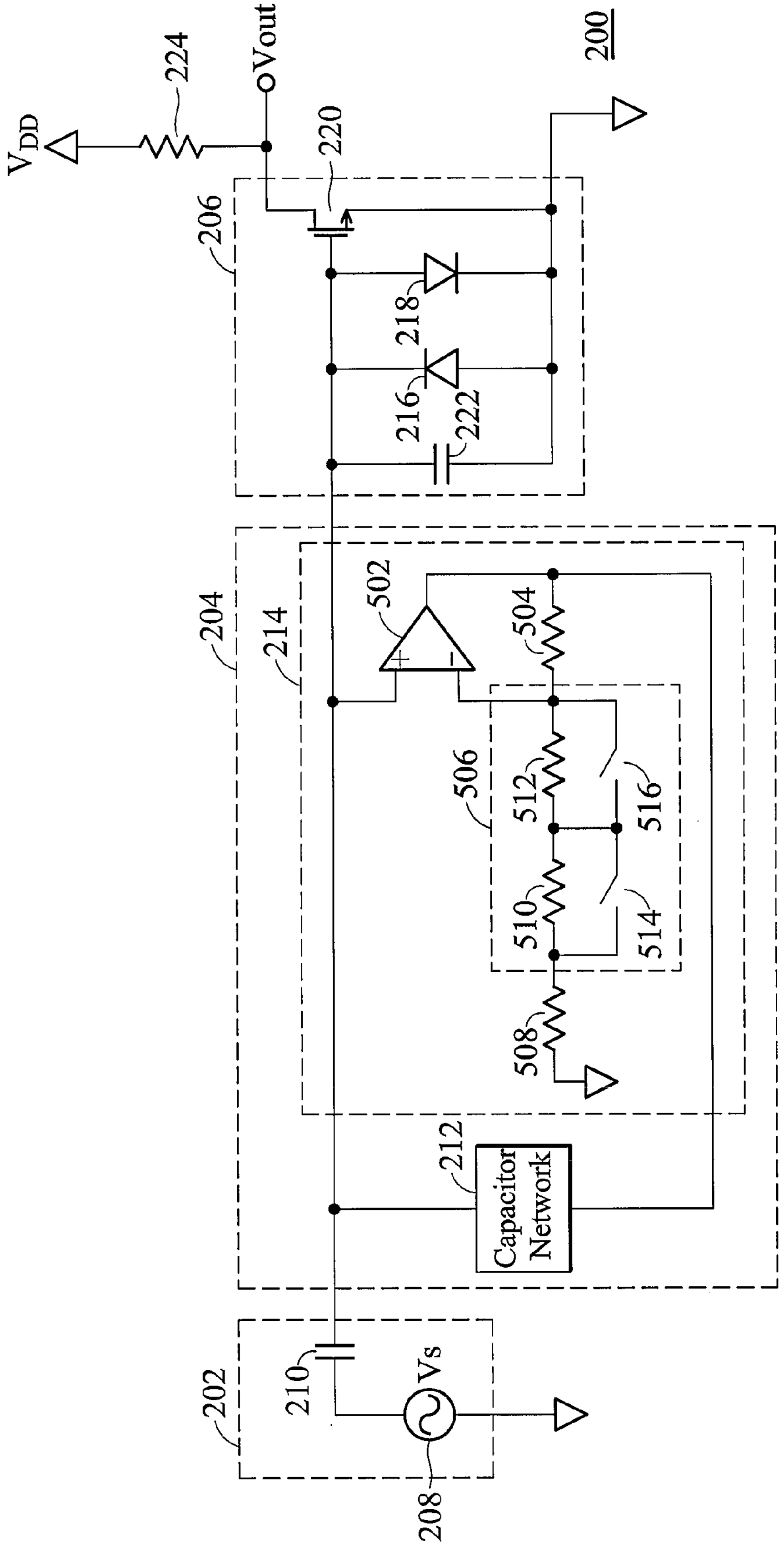

FIGS. 3-5 show different embodiments of capacitance reduction circuit 204 of FIG. 2. The transducer and the preamplifier showed in FIGS. 3-5 have the same functionalities as in FIG. 2, and will not be described in detail for brevity. In FIG. 3, capacitor network 212 can comprise a capacitor 302, and gain stage 214 can comprise an operational amplifier 304 and resistors 306 and 308. Operational amplifier 304 comprises an inverting terminal, a non-inverting terminal coupled to transducer 202, and an output terminal coupled to capacitor network 302. In this embodiment, the gain of gain stage 214 is determined by 1+R1/R2, where R1 and R2 are respectively the resistances of resistors 306 and 308, and the negative capacitance can be adjusted by changing the capacitance of capacitor 302 or the resistance ratio of resistor 306 to resistor 308. In a specific case, the capacitance of capacitor 302 is chosen as that of parasitic capacitor 222 and the resistance of resistor 308 is chosen as that of resistor 306 to ensure that voltage Vs will not be degraded at the input node of preamplifier 206 due to parasitic capacitor 222. In FIG. 4, capacitor network 212 can comprises capacitors 402, 404, and 406 and switches 408, 410, and 412. Each capacitor 402, 404, and 406 comprises a first terminal connected to transducer 202. Each switch 408, 410, and 412 is respectively coupled between a second terminal of the corresponding capacitor 402, 404, and 406 and the output of gain stage 214. Switches 408, 410, and 412 are used to adjust the equivalent capacitance of capacitor network 212. For example, the equivalent capacitance when switches 408, 410, and 412 are closed is larger than the equivalent capacitance when switches 408 and 410 are closed and switch 412 is open. It should be noted that the number of the capacitors and switches is not limited to the embodiment of FIG. 4, and other topologies of the capacitor network may be implemented without departing from the spirit of the disclosure.

In FIG. 5, gain stage 214 can comprise an operational amplifier 502, resistors 504 and 508, and a resistor network 506. Operational amplifier 502 comprises an inverting terminal, a non-inverting terminal coupled to transducer 202, and an output terminal coupled to capacitor network 212. Resistor 504 is coupled between the output terminal and the inverting terminal, resistor network 506 is coupled to the inverting terminal, and resistor 508 is coupled between resistor network 506 and the ground. Resistor network 506 can comprise resistors 510 and 512 and switches 514 and 516. Resistors 510 and 512 are connected between the inverting terminal and resistor 508 in serial, and switches 514 and 516 are respectively parallel connected to resistors 510 and 512. Switches 514 and 516 are used to adjust the equivalent resistance of resistor network 506. For example, the equivalent resistance when switches 514 and 516 are open is larger than the equivalent resistance when switch 514 is closed and switch 516 is open. Adjusting the equivalent resistance of resistor network 506 can change the gain of gain stage 214, and it should be noted that the number of the resistors and switches is not limited to the embodiment of FIG. 5, and other topologies of the resistor network may be implemented without departing from the spirit of the disclosure.

Figure 6:
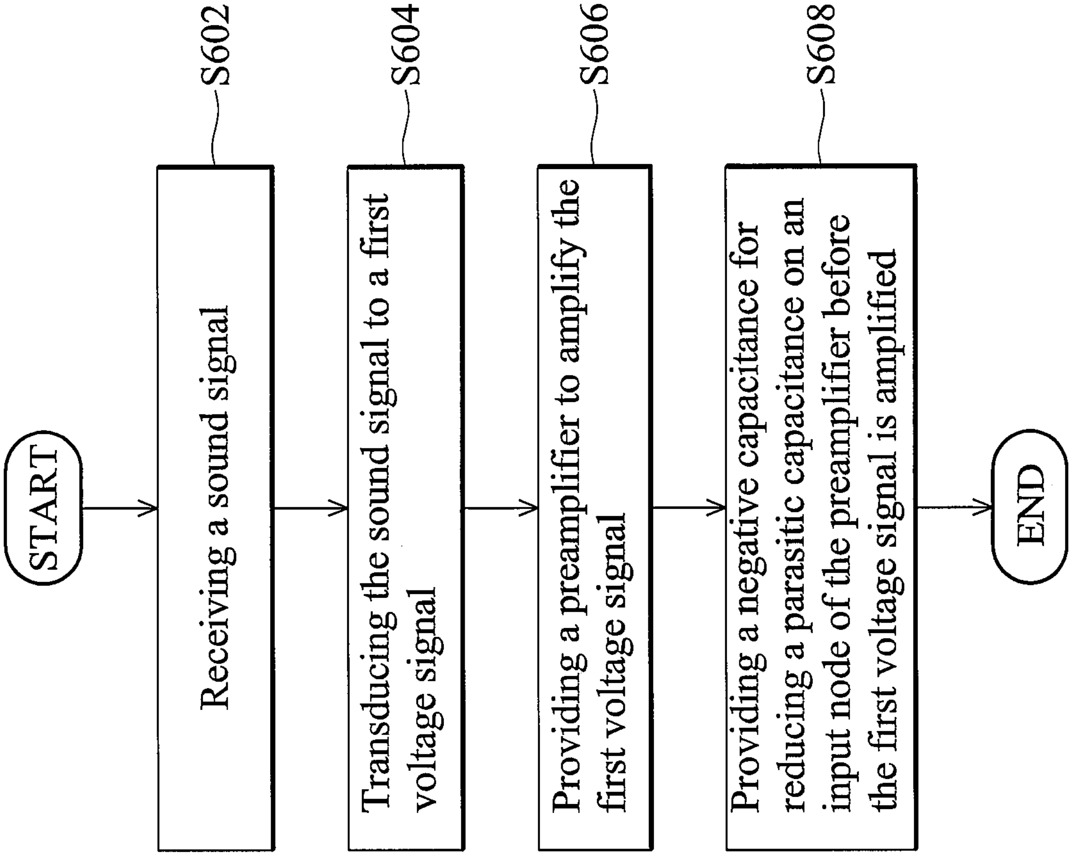
FIG. 6 is an embodiment of an audio processing method used in a microphone.

FIG. 6 is an embodiment of audio processing method used in a microphone. Firstly, a sound signal is received (step S602). Next, the sound signal is transduced to a first voltage signal (step S604). Next, a preamplifier is provided to amplify the first voltage signal (step S606). Finally, a negative capacitance is provided for reducing a parasitic capacitance on an input node of the preamplifier before the first voltage is amplified (step S608). In one embodiment, the negative capacitance can be provided by a capacitor network comprising a first terminal coupled to the preamplifier and a second terminal receiving a second voltage signal exceeding the first voltage signal, and the negative capacitance can be determined by adjusting the equivalent capacitance of the capacitor network. In another embodiment, the second voltage signal can be generated by amplifying the first voltage signal with a gain larger than 1, and the negative capacitance can be determined by adjusting the gain. Still in another embodiment, the negative capacitance can be determined by both the equivalent capacitance of the capacitor network and the gain, and the equivalent capacitance can be chosen as the parasitic capacitance and the gain can be chosen as 2 to completely eliminate the parasitic capacitance.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An audio processing system, comprising:
a transducer configured to transduce a sound signal to a voltage signal;
a gain stage comprising an input coupled to the transducer and an output;
a capacitor network, coupled between the output of the gain stage and the transducer, configured to provide an equivalent capacitance; and
a preamplifier, coupled to the transducer, configured to amplify the voltage signal.

2. The audio processing system as claimed in claim 1, wherein the preamplifier further comprises a pair of diodes with an inverse parallel connection, coupled between the transducer and a ground, configured to provide a current path for electrostatic discharge.

3. The audio processing system as claimed in claim 1, wherein a parasitic capacitance is induced from the preamplifier, and the gain stage and the capacitor network together form a negative capacitance to reduce the parasitic capacitance.

4. The audio processing system as claimed in claim 3, wherein the negative capacitance is controlled by the equivalent capacitance of the capacitor network and a gain of the gain stage.

5. The audio processing system as claimed in claim 1, wherein the gain stage further comprises:
an operational amplifier comprising an inverting terminal, a non-inverting terminal coupled to the transducer, and an output terminal coupled to the capacitor network;
a first resistor coupled between the output terminal and the inverting terminal; and
a second resistor coupled between the inverting terminal and a ground.

6. The audio processing system as claimed in claim 1, wherein the capacitor network comprises a capacitor.

7. The audio processing system as claimed in claim 1, wherein the capacitor network comprises:
a plurality of capacitors, and each capacitor comprising a first terminal connected to the transducer; and
a plurality of switches, and each switch respectively coupled between a second terminal of the corresponding capacitor and the output of the gain stage, configured to adjust an equivalent capacitance of the capacitor network.

8. The audio processing system as claimed in claim 1, wherein the gain stage further comprises:
an operational amplifier comprising an inverting terminal, a non-inverting terminal coupled to the transducer, and an output terminal coupled to the capacitor network;
a first resistor coupled between the output terminal and the inverting terminal;
a resistor network coupled to the inverting terminal; and
a second resistor coupled between the resistor network and a ground.

9. The audio processing system as claimed in claim 8, wherein the resistor network comprises:
a plurality of third resistors connected between the inverting terminal and the second resistor in serial; and
a plurality of switches, each switch respectively parallel connected to each resistor, configured to adjust an equivalent resistance of the resistor network.

10. An audio processing method used in a microphone, comprising:
receiving a sound signal;
transducing the sound signal to a first voltage signal;
providing a preamplifier to amplify the first voltage signal; and
providing a negative capacitance for reducing a parasitic capacitance on an input node of the preamplifier before the first voltage signal is amplified.

11. The audio processing method as claimed in claim 10, wherein the negative capacitance is provided by a capacitor network comprising a first terminal coupled to the preamplifier and a second terminal receiving a second voltage signal exceeding the first voltage signal.

12. The audio processing method as claimed in claim 11, wherein the negative capacitance is provided by adjusting an equivalent capacitance of the capacitor network to determine the negative capacitance.

13. The audio processing method as claimed in claim 11, wherein the negative capacitance is provided by amplifying the first voltage signal with a gain larger than 1 to generate the second voltage signal.

14. The audio processing method as claimed in claim 13, wherein the negative capacitance is provided by adjusting the gain to determine the negative capacitance.

15. The audio processing method as claimed in claim 13, wherein the negative capacitance is determined by an equivalent capacitance of the capacitor network and the gain.

16. The audio processing method as claimed in claim 15, wherein the equivalent capacitance is chosen as the parasitic capacitance and the gain is chosen as 2.

* * * * *